United States Patent [19]
Ishibashi et al.

[11] 4,167,745
[45] Sep. 11, 1979

[54] MIS-TYPE FIELD EFFECT TRANSISTOR AND METHOD OF PRODUCING THE SAME

[75] Inventors: Masayuki Ishibashi; Tuneo Morita, both of Kawasaki, Japan

[73] Assignee: Tokyo Shibaura Electric Co., Ltd., Japan

[21] Appl. No.: 851,957

[22] Filed: Nov. 16, 1977

[30] Foreign Application Priority Data

Nov. 18, 1976 [JP] Japan .................................. 51-137839

[51] Int. Cl.² ............................................. H01L 29/78
[52] U.S. Cl. ........................................ 357/23; 357/55; 357/56
[58] Field of Search .............................. 357/23, 55, 56

[56] References Cited
U.S. PATENT DOCUMENTS 4,074,300   2/1978   Sakai et al. ............................. 357/23

*Primary Examiner*—Edward J. Wojciechowicz
*Attorney, Agent, or Firm*—Finnegan, Henderson, Farabow & Garrett

[57] ABSTRACT

An MIS-type field effect transistor, comprising a semiconductor substrate having a projection, source and drain regions formed in the substrate with the projection intervening therebetween, and a gate structure formed on the surface of the projection. The transistor is advantageous for enhancing the integration degree of an integrated circuit.

5 Claims, 7 Drawing Figures

MIS-TYPE FIELD EFFECT TRANSISTOR AND METHOD OF PRODUCING THE SAME

BACKGROUND OF THE INVENTION

This invention relates to an improvement of an MIS-type field effect transistor.

For achieving a large scale integration (LSI), it is necessary to decrease the surface area of each of the semiconductor elements constituting an intergrated circuit (IC). Where MIS-type field effect transistors (FET) are included in the IC, the reduction of the surface area naturally results in the shortened channel region of the FET. However, a so-called "short channel effect" is generated if the channel region is made too short in a conventional MIS-type FET, resulting in difficulties with respect to the design and analysis of a large scale IC including such FET's. To be more specific, the threshold voltage of an MIS-type FET having a sufficiently long channel region is determined by the impurity, etc. introduced into the channel region, not by the length of the channel region. However, the threshold voltage depends to a large extent on the length of the channel region if the channel region is made unduly short, resulting in an enlarged variation of the threshold voltages among the FET's. Naturally, the enlarged variation presents a big problem to be solved in the manufacture of MIS-type FET's. Incidentally, the "short channel effect" is described in detail in L.D. Yau, "Solid State Electronics", Vol. 17, page 1,059, 1974 and Lee, "Solid State Electronics", Vol. 16, page 1,407, 1973.

SUMMARY OF THE INVENTION

An object of this invention is to provide an MIS-type FET small in surface area and free from the short channel effect, rendering it possible to enhance the integration degree of an IC.

According to this invention, there is provided an MIS-type FET, comprising a semiconductor substrate having a projection, source and drain regions formed in the substrate with the projection intervening therebetween, and a gate structure formed on the surface of the projection.

The MIS-type FET of this invention is produced by the method comprising the steps of preparing a semiconductor substrate of one conductivity type having a projection, forming a field insulation film at a predetermined distance from the projection so as to define the transistor region, forming a gate insulation film on the projection and a gate electrode on the gate insulation film, and introducing an impurity of the opposite conductivity type into the substrate so as to form source and drain regions.

DETAILED DESCRIPTION OF THE PREFERRED EMBODIMENTS

Described in the following is an N-channel type FET according to a preferred embodiment of this invention, with reference to the accompanying drawings.

Figure 1:
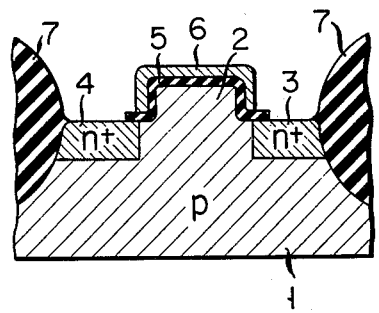
FIG. 1 is a cross sectional view of an MIS-type FET according to one embodiment of this invention.

As seen from FIG. 1 showing an N-channel type FET of this invention, a p-type silicon substrate (1) is provided with a projection (2), and an n-type source region (3) and an n-type drain region (4) are formed by impurity diffusion into the substrate (1) with the projection (2) intervening therebetween. Further, a gate structure consisting of a gate insulation film (5) and a gate electrode layer (6) laminated on the film (5) is formed on the surface of the projection (2). In the drawing, a reference numeral (7) denotes a field insulation film surronding the source region (3), the drain region (4) and the gate structure.

Figure 2A:
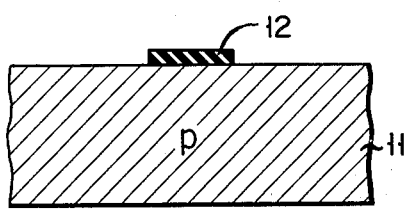
FIGS. 2(a) to 2(d) are cross sectional views showing the steps of producing the MIS-type FET shown in FIG. 1.

FIGS. 2(a) to 2(d) collectively show how to produce the MIS-type FET shown in FIG. 1. As shown in FIG. 2(a), a masking layer (12) consisting of $SiO_2$, $Si_3N_4$ or a photo resist in selectively formed first on a p-type silicon substrate (11). Then, the surface of the substrate (11) is subjected to etching, thereby forming a projection (13). Namely, the surface region of the substrate (11) is removed by the etching except the region beneath the masking layer (12), resulting in that the surface region beneath the masking layer serves to form the projection (13).

Figure 2B:
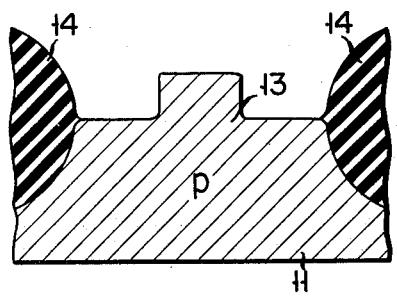

Subsequent to the etching for the formation of the projection (13), the masking layer (12) is removed by etching, followed by covering the exposed projection (13) and the surface of the substrate (11) around the projection (13) with an anti-oxidation mask (not shown). Then, the surface of the substrate (11) is subjected to a thermal oxidation treatment, thereby forming a field insulation film (14) consisting of silicon dioxide. After the formation of the film (14), the anti-oxidation film is removed, thereby providing a construction as shown in FIG. 2(b).

In the embodiment described above, the projection (13) is formed by selective etching. But, the projection (13) may also be formed by a crystal growth method.

Figure 2C:
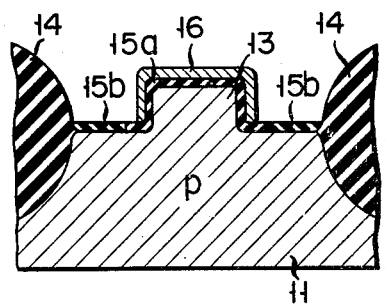
Figure 2D:
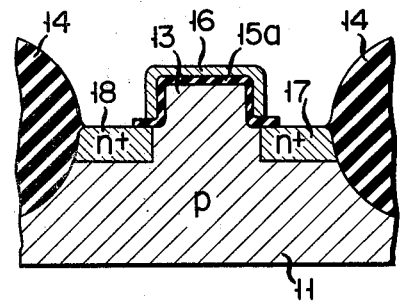

As shown in FIG. 2(c), the projection (13) is then covered with a gate insulation film (15a) consisting of silicon dioxide and, further, with a metal layer (16) acting as a gate electrode. Finally, an n-type impurity is introduced into the substrate (11) between the projection (13) and the field insulation film (14) by ion implantation method or thermal diffusion method so as to form an n-type source region (17) and an n-type drain region (18) as shown in FIG. 2(d). In the case of employing the ion implantation method, it is unnecessary to remove prior to the ion implantation a gate insulation film (15b) disposed on the surface of the substrate (11) between the projection (13) and the field insulation film (14) as shown in FIG. 2(c).

Figure 3:
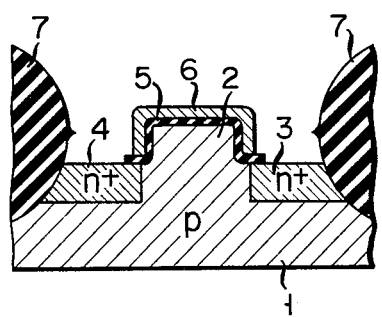
FIGS. 3 and 4 are cross sectional views of MIS-type FET's according to additional embodiments of this invention.
Figure 4:
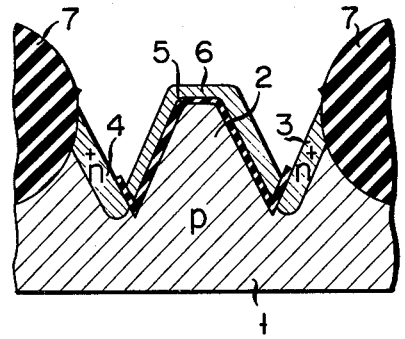

FIGS. 3 and 4 show modifications of the FET shown in FIG. 1. The reference numerals shown in FIGS. 3 and 4, which are the same as those of FIG. 1, denote the same members. The MIS-type FET as shown in FIG. 3 is produced by, for example, the following steps. Namely, a p-type silicon substrate (1) is selectively subjected to thermal oxidation so as to form first a field insulation film (7), (7), followed by selectively forming a masking layer (not shown) of $SiO_2$, $Si_3N_4$ or a photo resist on the surface of the substrate (1) between the film (7), (7) and the subsequent step of etching so as to form a projection (2). Then, the step of FIG. 2(c) is conducted so as to form a gate insulation film (5) and a gate electrode (6) on the surface of the projection (2), followed by conducting the step of FIG. 2(d) for forming a source region (3) and a drain region (4). In producing an MIS-type FET as shown in FIG. 3, it is important that the height of the projection (2) (or, the depth of etching of the substrate (1)) be controlled to be less than half the thickness of the field insulation film (7).

The MIS-type FET as shown in FIG. 4 is produced by, for example, the following steps. Namely, a field insulation film (7), (7) is formed first on a p-type (100) silicon substrate (1) by selective thermal oxidation of the surface of the substrate (1), followed by etching of the substrate (1) with an etching solution having a directionality such as hydrazine so as to form a trapezoidal projection (2). Then, a gate insulation film (5), a gate electrode (6), a source region (3) and a drain region (4) are formed by the steps of FIGS. 2(c) and 2(d).

As described in detail, the MIS-type FET of this invention comprises a gate insulation film formed on the surface of a projection of a semiconductor substrate. Accordingly, it is possible to provide a long gate insulation film, i.e., a long channel region, without enlarging the distance between the source and drain regions. It follows that the surface area of the MIS-type FET formed in the semiconductor substrate can be decreased without generation of the short channel effect, enabling the technique of this invention to be very effective for enhancing the integration degree of an IC.

What we claim is:

1. A MIS-type field effect transistor, comprising:
   a semiconductor substrate of one conductivity type;
   spaced-apart source and drain regions of the opposite conductivity type formed at one surface of said semiconductor substrate;
   a semiconductor projection of said one conductivity type formed integrally on the substrate surface between said source and drain regions;
   a gate insulation film overlying the surface of the projection between the source and drain regions; and
   a gate electrode mounted on the gate insulation film, a long channel region being formed between the source and drain regions along the surface of the semiconductor projection.

2. The transistor according to claim 1, wherein the projection of the substrate is substantially oblong in cross section.

3. The transistor according to claim 1, wherein the projection of the substrate is substantially trapezoidal in cross section.

4. A method of producing a MIS-type field effect transistor, comprising the steps of:
   forming a semiconductor substrate of one conductivity type;
   forming spaced-apart source and drain regions of the opposite conductivity type at one surface of said semiconductor substrate;
   forming a semiconductor projection of said one conductivity type integrally on the substrate surface between said source and drain regions;
   forming a gate insulation film overlying the surface of the projection between the source and drain regions; and
   mounting a gate electrode on the gate insulation film to form a long channel region between the source and drain regions along the surface of the semiconductor projection.

5. The method according to claim 1, wherein the field insulation film is formed before the step of forming the projection on the surface of the substrate.

* * * * *